United States Patent
Chen et al.

(10) Patent No.: US 6,745,901 B2
(45) Date of Patent: Jun. 8, 2004

(54) WAFER CASSETTE EQUIPPED WITH PIEZOELECTRIC SENSORS

(75) Inventors: Kuen-Ei Chen, Tainan (TW); Hung-Shan Lan, Nantou (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 132 days.

(21) Appl. No.: 09/976,066

(22) Filed: Oct. 12, 2001

(65) Prior Publication Data

US 2003/0070960 A1 Apr. 17, 2003

(51) Int. Cl.⁷ .......................... B65D 85/48; A47G 19/08

(52) U.S. Cl. ....................... 206/711; 206/454; 206/832; 211/41.18

(58) Field of Search ................................ 206/711, 710, 206/701, 454, 449, 459.1, 832; 211/41.18; 414/935–940; 340/686.1, 686.6, 689, 686.2, 665, 666, 686.5

(56) References Cited

U.S. PATENT DOCUMENTS

| | | | | |
|---|---|---|---|---|
| 5,225,691 A | * | 7/1993 | Powers et al. | 414/937 |
| 6,105,782 A | * | 8/2000 | Fujimori et al. | 206/710 |
| 6,113,165 A | * | 9/2000 | Wen et al. | 414/941 |
| 6,297,641 B1 | * | 10/2001 | Mattes et al. | 340/686.1 |

FOREIGN PATENT DOCUMENTS

JP   61047501 A   *   3/1986   ............ G01B/7/00

* cited by examiner

Primary Examiner—Mickey Yu
Assistant Examiner—Gregory Pickett
(74) Attorney, Agent, or Firm—Tung & Associates

(57) ABSTRACT

A wafer cassette for storing and transporting wafers that is equipped with sensors such as piezoelectric sensors or capacitance sensors on the surface of the dividers for sensing the presence or absence of wafers positioned on top of the dividers is described. The sensors are capable of detecting any defective placement of wafers such as a cross-slot placement or a double placement such that the condition can be corrected by a machine operator and a wafer cassette can be stopped before it is loaded into an internal buffer of a process machine.

14 Claims, 2 Drawing Sheets

WAFER CASSETTE EQUIPPED WITH PIEZOELECTRIC SENSORS

FIELD OF THE INVENTION

The present invention generally relates to a container for holding and transporting semiconductor wafers and more particularly, relates to a wafer cassette for transporting wafers in a semiconductor fabrication facility wherein the cassette is equipped with piezoelectric sensors that are mounted in the dividers for sensing the presence or absence of wafers on the dividers.

BACKGROUND OF THE INVENTION

In the fabrication process for semiconductor devices, wafers formed of a semi-conducting material pass through various processes in which a plurality of wafers are frequently processed simultaneously. For instance, in a low pressure chemical vapor deposition (LPCVD) reactor, a large number of wafers can be processed by stacking them side by side with only a few millimeters apart in a quartz reaction tube. The quartz reaction tube, sometimes called wafer boats, can hold up to 200 wafers. When wafers are held vertically and separated from each other by a narrow space, a maximum wafer capacity can be achieved in a reaction chamber. For instance, wafers can be positioned in a diffusion or oxidation furnace wherein the wafers are placed perpendicular to a gas flow in a circular cross-sectioned quartz tube.

When a reactor is designed for a specific process, the geometry of the reactor is dictated by the pressure source and the energy source utilized in the reactor. The geometry of the reactor is also an important factor in the through-put rate of the reactor. In general, a reactor should be designed such that an equal flow of reactants can be delivered uniformly to each wafer. It is therefor desirable to stack the wafers horizontally by laying them flat on a horizontal surface instead of stacking vertically at close spacing, even though the horizontal layout is more susceptible to contamination by falling particles.

A vertical furnace operates essentially in the same manner as a horizontal furnace, except for the orientation of the wafers. In a vertical furnace, the wafers are loaded into a horizontal position by a wafer transporting tool from a wafer cassette in which the wafers are stored or transported between processing stations. The wafer blade, or the wafer paddle that is utilized for transporting wafers into process machines from a wafer cassette is normally constructed of a metal or a ceramic material that is capable of withstanding high temperature and corrosive environments. The wafer cassette, on the other hand, is normally constructed of a plastic material that is basically a container which has an open front and corrugated sidewalls formed by dividers for separating the wafers stored therein. The wafer cassette can be advantageously injection molded of a plastic material for accommodating a specifically sized substrate, i.e., an eight inch or a twelve inch wafer. A typical wafer cassette is shown in FIG. 1.

The wafer cassette 10, as shown in FIG. 1, is constructed by a top wall 12, a bottom wall 14, a back wall 16, and sidewalls 18 and 22. A cavity 24 is defined by the walls which also provides a front opening 26. On the interior surfaces 28 and 32 of the sidewalls 18 and 22, a corrugated configuration is formed by a plurality of dividers 34 and 36. The dividers 34, 36 are formed in ridge-shape that are oriented parallel with the bottom wall 14 and perpendicular to the rear wall 16. Slot-shaped openings, or receptacles 38, 42 are formed by the dividers 34 and 36. The dividers 34 and 36 are formed in a suitable length and thickness such that an electronic substrate, e.g., a wafer can be easily slid therein.

Since the wafer cassette 10 is used to store wafers between various fabrication processes and to transport wafers between these processing stations, the wafers contained therein are frequently inspected by an operator either for quality reasons or for identification of the wafer lots. When a wafer 20 is taken out of the cassette 10 and then manually put back in, human error frequently occurs resulting in a wafer misplacement, i.e., a cross-slot or double placement of the wafer 20 as shown in FIG. 2. The cross-slot misplacement of a wafer into a wafer cassette occurs due to the large number of dividers on the sidewalls of the wafer cassette and the difficulty of identifying corresponding pairs of dividers on the opposite sidewalls of the cassette. The likelihood of making such mistakes is also further enhanced by the fact that the cassette is normally molded of a black plastic material.

When a cross-slot or double misplacement of wafers by an operator occurs, serious consequences can result when an automated wafer loader is used to unload the wafer from the cassette. For instance, when a wafer blade or paddle is used to unload wafers from a SMIF (standard mechanical interface machine) apparatus, the wafer blade or paddle may collide with the wafer that is misplaced or double placed resulting either in the breakage of a wafer, a damage to the wafer blade or both. In either event, the result can be catastrophic in lost wafers or machine down time.

In the wet bench processing of wafers, the wet bench equipment is normally provided with internal buffers for wafer cassette storage and for wafer mapping. For instance, an internal buffer for a wet bench can normally store up to 12 FOUPs (Front Opened Unified Pod). When a mapping error is discovered in the internal buffer, i.e., when wafer misplacement in the wafer cassettes is discovered, it is difficult and time consuming to unload the wafer cassettes from the internal buffer. It is always difficult to count wafers stored in the FOUPs by naked eyes.

It is therefore an object of the present invention to provide a wafer cassette for storing wafers that does not have the drawbacks or shortcomings of the conventional wafer cassettes.

It is another object of the present invention to provide a wafer cassette for storing wafers that is equipped with an automatic sensing device for detecting the placement of wafers in the cassette.

It is a further object of the present invention to provide a wafer cassette for storing wafers that is equipped with sensors in the top surface of the dividers for sensing the absence or presence of wafers.

It is another further object of the present invention to provide a wafer cassette for storing wafers that is equipped with piezoelectric thin film sensors imbedded in the top surface of dividers for sensing the presence or absence of wafers.

It is still another object of the present invention to provide a wafer cassette for storing wafers that is equipped with capacitance sensors for sensing the presence or absence of wafers on the dividers.

It is yet another object of the present invention to provide a wafer cassette for storing wafers that is equipped with piezoelectric sensors and an alarm panel for alerting an operator when a misplacement of wafers is detected in the cassette.

SUMMARY OF THE INVENTION

In accordance with the present invention, a wafer cassette for the storage and transporting of wafers that is equipped with sensors imbedded in the top surface of the dividers for sensing the presence or absence of wafers on top is provided.

In a preferred embodiment, a wafer cassette that is equipped with piezoelectric sensors is provided which includes a cassette body that has a top wall, a bottom wall, a rear wall and two sidewalls forming an open-front enclosure and defining a cavity therein, a left sidewall and a right sidewall, each has a corrugated interior surface, a first plurality of ridge-shaped dividers forming the corrugated interior surface, each of the sidewalls has a base portion integral with the sidewall and a tip portion extending outwardly from the sidewall toward the cavity in the body, the ridge-shaped dividers are oriented parallel to the bottom wall and perpendicular to the front opening defining slot-shaped receptacles therein between, a second plurality of ridge-shaped dividers forming the corrugated interior surface in the right sidewall. Each divider has a base portion integral with the sidewall and a tip portion extending outwardly from the sidewall toward the cavity in the body, the ridge-shaped dividers are oriented parallel to the bottom wall and perpendicular to the front opening defining slot-shaped receptacles therein between, and each of the first and second plurality of ridge-shaped dividers has a top surface and imbedded in the top surface at least one piezoelectric sensor for sensing the presence or absence of a single wafer positioned on the top surface.

The wafer cassette that is equipped with piezoelectric sensors may further include a controller means for receiving signals from the at least one piezoelectric sensor and for determining the presence or absence of the single wafer on top. The wafer cassette may further include an alarm means for alerting an operator when no wafer or more than one wafer is detected on the top surface. The piezoelectric sensor may be a piezoelectric thin film sensor. The wafer cassette may further include means for wafer mapping in the cassette.

The present invention is further directed to a container for holding substrates which include a body that has a top wall, a bottom wall, a rear wall and two sidewalls forming an enclosure that has a front opening and defining a cavity therein, a left sidewall and a right sidewall each has a corrugated interior surface, a first plurality of ridge-shaped dividers forming the corrugated interior surface on the left sidewall, each has a base portion integral with the sidewall and a tip portion extending outwardly from the sidewall into the cavity of the body, the ridge-shaped dividers are oriented parallel to the bottom wall and perpendicular to the front opening defining slot-shaped receptacles therein between, a second plurality of ridge-shaped dividers forming the corrugated interior surface on the right sidewall. Each has a base portion integral with the sidewall and a tip portion extending outwardly from the sidewall into the cavity in the body, the ridge-shaped dividers are oriented parallel to the bottom wall and perpendicular to the front opening defining slot-shaped receptacles therein between, each of the first and second plurality of ridge-shaped dividers has a top surface and imbedded in the top surface at least one sensor for sensing the presence or absence of a single substrate positioned on the top surface.

The container for holding substrates may be a semiconductor wafer cassette, while the substrates may be semiconductor wafers. The at least one sensor may be at least one piezoelectric sensor, or maybe at least one piezoelectric thin film sensor, or maybe at least one capacitance sensor. The container may further include a controller means for receiving signals from the at least one sensor and for determining the presence or absence of the single substrate. The container may further include an alarm means for alerting an operator when no wafer or more than one wafer is detected on top of the top surface. The container may further include means for wafer mapping semiconductor wafers stored in the container.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer cassette for storing and transporting wafers that is equipped with sensors, such as piezoelectric sensors or capacitance sensors, for sensing the correct placement of wafers in the cassette.

In the present invention wafer cassette, a sensor is imbedded in the top surface of dividers that are formed on the sidewalls of the cassette for defining slot-shaped receptacles for holding the wafers. When piezoelectric sensors are utilized, a small strain is produced in the sensor by the weight of a wafer when positioned on top of the sensor to induce an electric field to be generated and an electrical current to be produced. A signal is thus sent by the current to a process controller for wafer mapping and for indicating any defective placement of the wafers, such as cross-slot placement or double wafer placement. Each of the plurality of ridge-shaped dividers has in a top surface imbedded at least one sensor for sensing the presence or absence of a single wafer positioned on top of the divider.

The wafer cassette is further connected to an alarm means for alerting an operator when no wafer or more than one wafer is detected on top of any divider. Any incorrect placement of wafers can thus be detected before a wafer cassette is inputted into an internal buffer of a process machine, such as a wet bench equipment.

For instance, when piezoelectric sensors are used in the top surface of each divider for sensing the weight, i.e., or the displacement caused by the weight of the wafers. When two dividers on the opposite sidewalls have the same loading, it is an indication that one wafer is present on top off the two corresponding dividers. The wafers can thus be counted and mapped correctly. When one of the slots defined by the dividers has double loading, or twice the loading than a normal loading of one wafer, it is an indication that two wafers are present on the same set of dividers. Furthermore, if one side of the divider indicates no weight while the other side of the divider shows twice the loading than normal, it is an indication that a cross-slot water placement has occurred.

Figure 1:
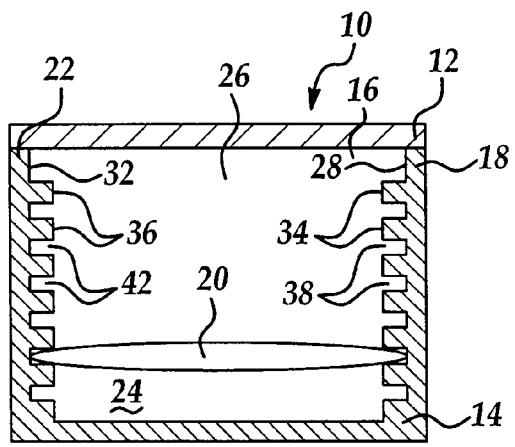
FIG. 1 is a cross-sectional view of a typical wafer cassette with a wafer stored therein.
Figure 2:
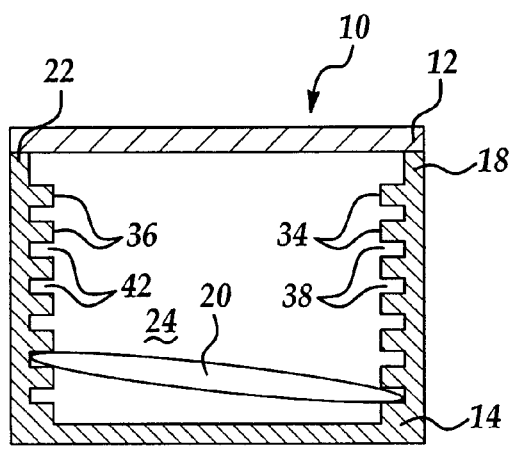
FIG. 2 is a cross-sectional view of the typical wafer cassette of FIG. 1 with a cross-slot placement of a wafer.
Figure 3:
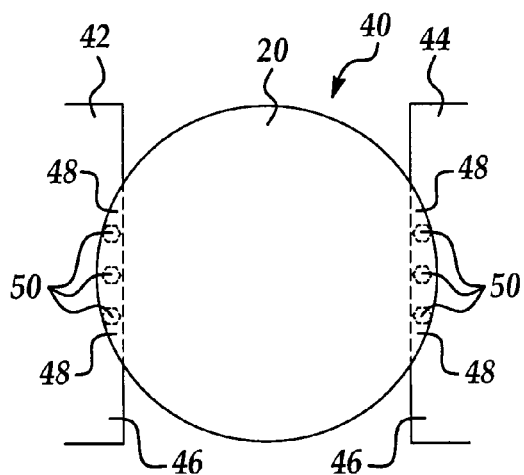
FIG. 3 is a plain view of a wafer positioned on two dividers of a present invention wafer cassette wherein the dividers are equipped with piezoelectric sensors.
Figure 4:
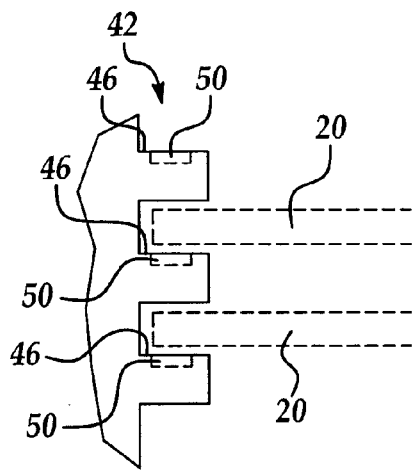
FIG. 4 is a partial, enlarged cross-sectional view of a present invention wafer cassette illustrating dividers equipped with piezoelectric sensors.

Referring now to FIG. 3 wherein a partial, plane view of a present invention wafer cassette 40 is shown. Two dividers 42,44 are used to support a wafer 20 positioned thereon. In a top surface 46 of the dividers 42,44, is embedded at least one sensor 50, which is also shown in FIG. 4 in a cross-sectional view. While a piezoelectric sensor may be suitably used as a sensor 50, any other suitable types of sensors, such as a capacitance sensor may also be utilized to indicate the presence or absence of a wafer positioned on top. The piezoelectric sensor is suitable for the present invention application since it is capable of sensing a small strain, i.e., a small displacement, caused by the weight of a wafer and thus producing an electric field which can be amplified into an electrical current for sending to a process controller.

As shown in FIG. 3, three sensors 50 are utilized on the edge of the dividers 42,44 for sensing the edge portion 48 of the wafer 20. However, any other suitable numbers of sensors, such as one or two, may also be used for sensing the edge portion 48 of the wafer 20. The capacitance sensor, when used, senses a capacitance change in the sensor with or without the wafer edge 48 placed on top.

Figure 5A:
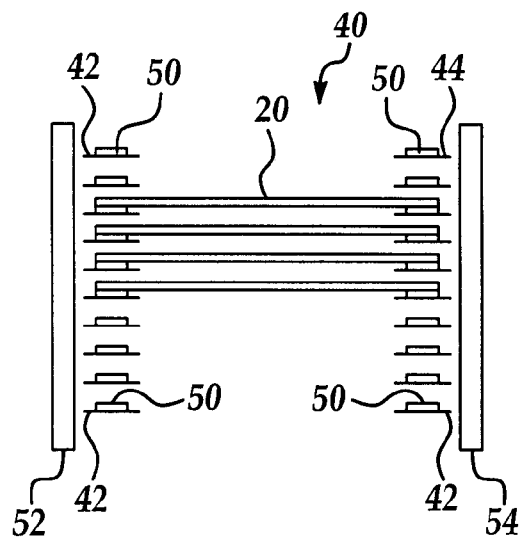
FIG. 5A is a cross-sectional view of a present invention wafer cassette loaded with wafers correctly positioned.
Figure 5B:
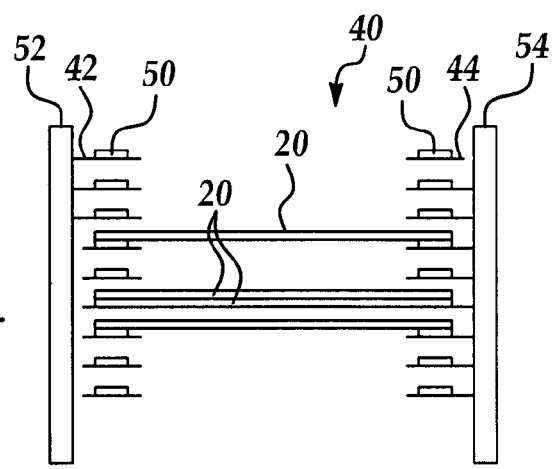
FIG. 5B is a cross-sectional view of the present invention wafer cassette wherein two wafers are double placed on one divider.
Figure 5C:
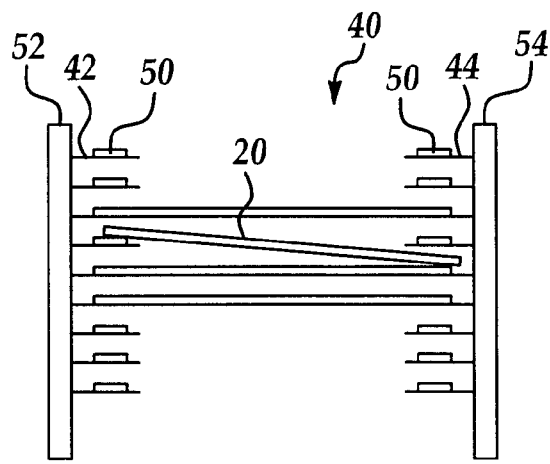
FIG. 5C is a cross-sectional view of the present invention wafer cassette illustrating a cross-slot placement of a wafer.

The operation of the present invention wafer cassette equipped with sensors in the dividers is shown in FIGS. 5A~5C. FIG. 5A indicates that the present invention wafer cassette 40 that has a left sidewall 52 and a right sidewall 54 each equipped with a plurality of dividers 42 and 44. Each of the dividers 42, 44 has mounted in a top surface of the divider, a sensor 50 for sending the presence or absence of a wafer 20 positioned thereon. The wafers 20, shown in FIG. 5A, are positioned correctly such that an accurate wafer mapping can be made by the signals received from the sensors 50.

When the double placement of wafers 20 occurs as shown in FIG. 5B, the dividers 42, 44 that carry the double wafers 20 send out signals indicative of twice the strain being produced by the double weight of the wafers, and thus causing an alarm to be triggered.

Another example of defective wafer placement is shown in FIG. 5C, wherein a cross-slot placement of wafer 20 has occurred. When the cross-slot placement occurs, the sensor on the left sidewall 52 senses a single wafer, while the corresponding sensor on the right sidewall 54 senses no wafer positioned on top. Signals are thus sent to the process controller to indicate that a cross-slot defective placement has occurred to alert the operator.

When one of the defective placement conditions, shown in either FIG. 5B or in FIG. 5C has occurred, the machine operator is alerted to the defective placement condition and can thus stop the wafer cassette 40 from being loaded into an internal buffer of a process machine. Such prevention can save the costly and time consuming task of retrieving such defectively placed wafer cassette from the internal buffer, and avoid a loss in throughput.

The present invention wafer cassette for loading and storing wafers that is equipped with piezoelectric sensors or capacitance sensors has therefore been amply described in the above descriptions and in the appended drawings of FIGS. 3~5C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer cassette equipped with piezoelectric sensors comprising:

a cassette body having a top wall, a bottom wall, a rear wall and two sidewalls forming an open-front enclosure and defining a cavity therein, a left sidewall and a right sidewall each having a corrugated interior surface, a first plurality of ridge-shaped dividers forming said corrugated interior surface in said left sidewall each having a base portion integral with the sidewall and a tip portion extending outwardly from said sidewall toward said cavity in said body, said ridge-shaped dividers being oriented parallel to said bottom wall and perpendicular to said front opening defining slot-shaped receptacles therein between, a second plurality of ridge-shaped dividers forming said corrugated interior surface in said right sidewall each having a base portion integral with the sidewall and a tip portion extending outwardly from said sidewall toward said cavity in said body, said ridge-shaped dividers being oriented parallel to said bottom wall and perpendicular to said front opening defining slot-shaped receptacles therein between, and each of said first and second plurality of ridge-shaped dividers having a top surface and embedded in said top surface at least one piezoelectric sensor for sensing the presence or absence of a single water positioned on said top surface.

2. A wafer cassette equipped with piezoelectric sensors according to claim 1 further comprising a controller means for receiving signals from said at least one piezoelectric sensor and for determining the presence or absence of said single wafer on top.

3. A wafer cassette equipped with piezoelectric sensors according to claim 1 further comprising an alarm means for alerting an operator when no wafer or more than one wafer is detected on top of said top surface.

4. A wafer cassette equipped with piezoelectric sensors according to claim 1 wherein said piezoelectric sensor is a piezoelectric thin film sensor.

5. A water cassette equipped with piezoelectric sensors according to claim 1 further comprising means for wafer mapping in said cassette.

6. A container for holding substrates comprising:

a cassette body having a top wall, a bottom wall, a rear wall and two sidewalls forming an open-front enclosure and defining a cavity therein, a left sidewall and a right sidewall each having a corrugated interior surface, a first plurality of ridge-shaped dividers forming said corrugated interior surface in said left sidewall each having a base portion integral with the sidewall and a tip portion extending outwardly from said sidewall toward said cavity in said body, said ridge-shaped dividers being oriented parallel to said bottom wall and perpendicular to said front opening defining slot-shaped receptacles therein between, a second plurality of ridge-shaped dividers forming said corrugated interior surface on said right sidewall each having a base portion integral with the sidewall and a tip portion extending outwardly from said sidewall into said cavity in said body, said ridge-shaped dividers being oriented parallel to said bottom wall and perpendicular to said front opening defining slot-shaped receptacles therein between, and each of said first and second plurality of ridge-shaped dividers having a top surface and embedded in said top surface at least one sensor for sensing the presence or absence of a single substrate positioned on said top surface.

7. A container for holding substrates according to claim 6, wherein said container is a semiconductor wafer cassette.

8. A container for holding substrates according to claim 6, wherein said substrates are semiconductor wafers.

9. A container for holding substrates according to claim 6, wherein said at least one sensor is at least one piezoelectric sensor.

10. A container for holding substrates according to claim 6, wherein said at least one sensor is at least one piezoelectric thin film sensor.

11. A container for holding substrates according to claim 6, wherein said at least one sensor is at least one capacitance sensor.

12. A container for holding substrates according to claim 6, further comprising a controller means for receiving signals from said at least one sensor and for determining the presence or absence of said single substrate.

13. A container for holding substrates according to claim 6, further comprising an alarm means for alerting an operator when no wafer or more than one wafer is detected on top of said top surface.

14. A container for holding substrates according to claim 6, further comprising means for wafer mapping semiconductor wafers stored in said container.

* * * * *